United States Patent
Chang et al.

(10) Patent No.: US 12,394,499 B2
(45) Date of Patent: Aug. 19, 2025

(54) ANTIFUSE-TYPE NON-VOLATILE MEMORY AND CONTROL METHOD THEREOF

(71) Applicant: eMemory Technology Inc., Hsin-Chu (TW)

(72) Inventors: Chia-Fu Chang, Hsinchu County (TW); Jen-Yu Peng, Hsinchu County (TW); Ming-Hsuan Tan, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 222 days.

(21) Appl. No.: 18/370,412

(22) Filed: Sep. 20, 2023

(65) Prior Publication Data
US 2024/0161844 A1 May 16, 2024

Related U.S. Application Data

(60) Provisional application No. 63/424,966, filed on Nov. 14, 2022.

(51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ................................ G11C 17/18; G11C 17/16
USPC .......................................................... 365/96
See application file for complete search history.

(56) References Cited

U.S. PATENT DOCUMENTS

| | | | | |
|---|---|---|---|---|
| 5,726,944 A | * | 3/1998 | Pelley, III | G11C 11/412 365/207 |
| 7,808,838 B2 | | 10/2010 | Kim et al. | |
| 2017/0053707 A1 | * | 2/2017 | Liao | G11C 17/16 |
| 2019/0392911 A1 | * | 12/2019 | Jo | G11C 8/10 |
| 2020/0227103 A1 | * | 7/2020 | Shao | G11C 8/20 |

FOREIGN PATENT DOCUMENTS

EP   3396672 B1   6/2020

OTHER PUBLICATIONS

Office Action issued by Taiwan Intellectual Property Office on Aug. 5, 2024.

\* cited by examiner

*Primary Examiner* — Amir Zarabian
*Assistant Examiner* — Minh Dinh
(74) *Attorney, Agent, or Firm* — WPAT, PC

(57) ABSTRACT

An antifuse-type non-volatile memory and a control method for the antifuse-type non-volatile memory are provided. During a program action of a program cycle, a timing controller generates a timing control signal. According to the timing control signal, a word line driver is controlled to provide an on voltage and an off voltage to an activated word line. In a total time period of plural on periods, the program current is sufficient to rupture a gate oxide layer of an antifuse transistor in the selected memory cell, and a heating process is completed. Consequently, the gate oxide layer of the antifuse transistor is in a solid rupture state. Consequently, the program action can be successfully performed on the selected memory cell.

15 Claims, 7 Drawing Sheets

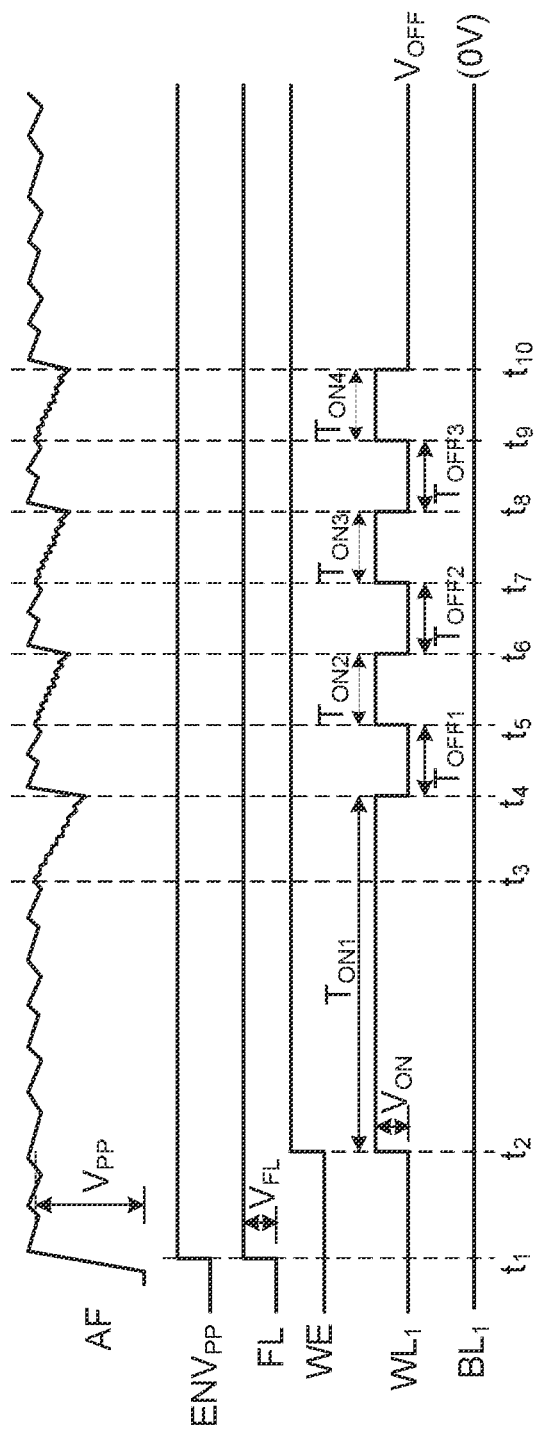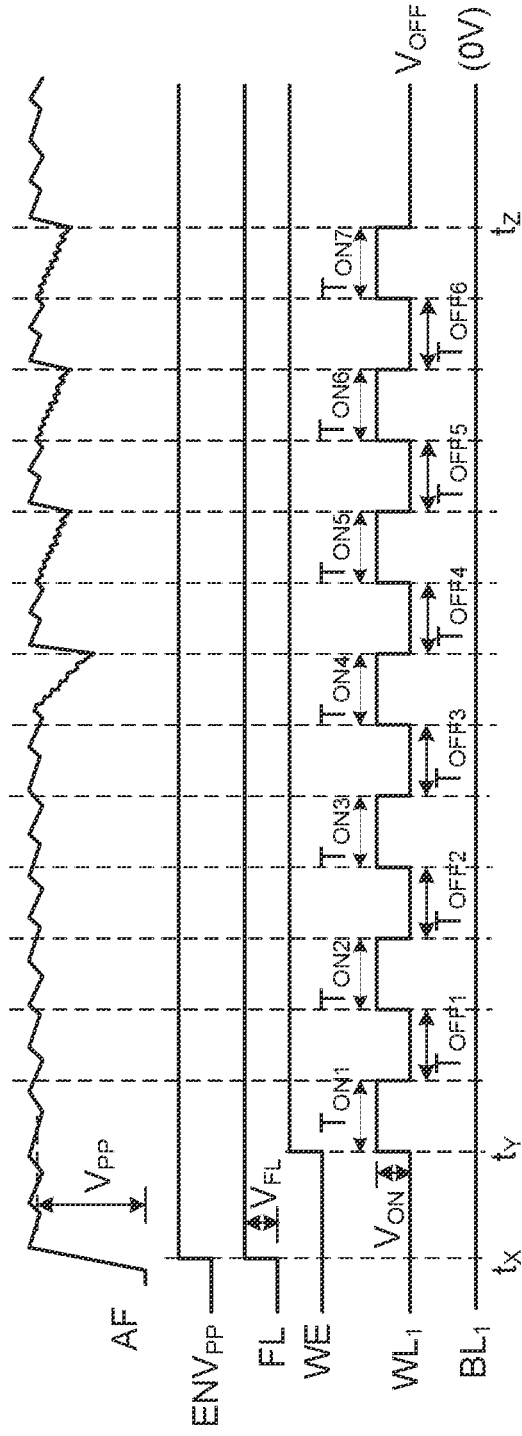

ANTIFUSE-TYPE NON-VOLATILE MEMORY AND CONTROL METHOD THEREOF

FIELD OF THE INVENTION

The present invention relates to a non-volatile memory, and more particularly to an antifuse-type non-volatile memory and a control method for the antifuse-type non-volatile memory.

BACKGROUND OF THE INVENTION

The non-volatile memories may be classified into a multi-time programming memory (also referred as a MTP memory), a one time programming memory (also referred as an OTP memory) and a mask read only memory (also referred as a Mask ROM).

Generally, the MTP memory can be programmed many times, and the stored data of the MTP memory can be modified many times. On the contrary, the OTP memory can be programmed once. After the OTP memory is programmed, the stored data cannot be modified. Moreover, after the Mask ROM leaves the factory, all stored data have been recorded therein. The user is only able to read the stored data from the Mask ROM, but is unable to program the Mask ROM.

For example, an antifuse-type non-volatile memory is a one of the OTP memories. Before the memory cell of the antifuse-type non-volatile memory is programmed, the memory cell of the antifuse-type non-volatile memory is in a high-resistance storage state. After the memory cell of the antifuse-type non-volatile memory is programmed, the memory cell of the antifuse-type non-volatile memory is in a low-resistance storage state. In addition, after the memory cell of the antifuse-type non-volatile memory is programmed, the stored data cannot be modified.

SUMMARY OF THE INVENTION

An embodiment of the present invention provides an antifuse-type non-volatile memory. The antifuse-type non-volatile memory includes an antifuse-type memory cell array and a control circuit. The antifuse-type memory cell array includes a first memory cell. The first memory cell is connected with an antifuse control line. A first word line and a first bit line. The first memory cell includes an antifuse transistor and a select transistor. A first drain/source terminal of the select transistor is connected with the first bit line. A gate terminal of the select transistor is connected with the first word line. A first drain/source terminal of the antifuse transistor is coupled to a second drain/source terminal of the select transistor. A gate terminal of the antifuse transistor is connected with the antifuse control line. The control circuit includes an oscillator, a program voltage generator, a timing controller, a word line driver and a bit line driver. The oscillator generates a clock signal. The program voltage generator includes a charge pump. The charge pump is connected with the oscillator to receive the clock signal. When a program action is performed, a supply voltage is boosted to a program voltage by the charge pump according to the clock signal, and the program voltage is provided to the antifuse control line. The timing controller is connected with the oscillator. The timing controller receives the clock signal and generates a timing control signal. The word line driver is connected with the first word line of the antifuse-type memory cell array. The word line driver is connected with the timing controller to receive the timing control signal. The bit line driver is connected with the first bit line of the antifuse-type memory cell array. In a program cycle of the program action, the first word line is activated by the word line driver, and the first bit line is activated by the bit line driver, so that the first memory cell is a selected memory cell. In the program cycle of the program action, the word line driver issues a pulse signal to the first word line according to the timing control signal. A first level of the pulse signal is an on voltage. A second level of the pulse signal is an off voltage. After the program cycle, a storage state of the first memory cell is switched from a high-resistance storage state to a low-resistance storage state.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 3B is a schematic timing waveform diagram illustrating associated signals when the memory cell of the antifuse-type non-volatile memory of the second embodiment undergoes the program action;

FIG. 3C is a schematic timing waveform diagram illustrating another signal when the memory cell of the antifuse-type non-volatile memory of the second embodiment undergoes the program action;

DETAILED DESCRIPTION OF PREFERRED EMBODIMENTS

Figure 1A:
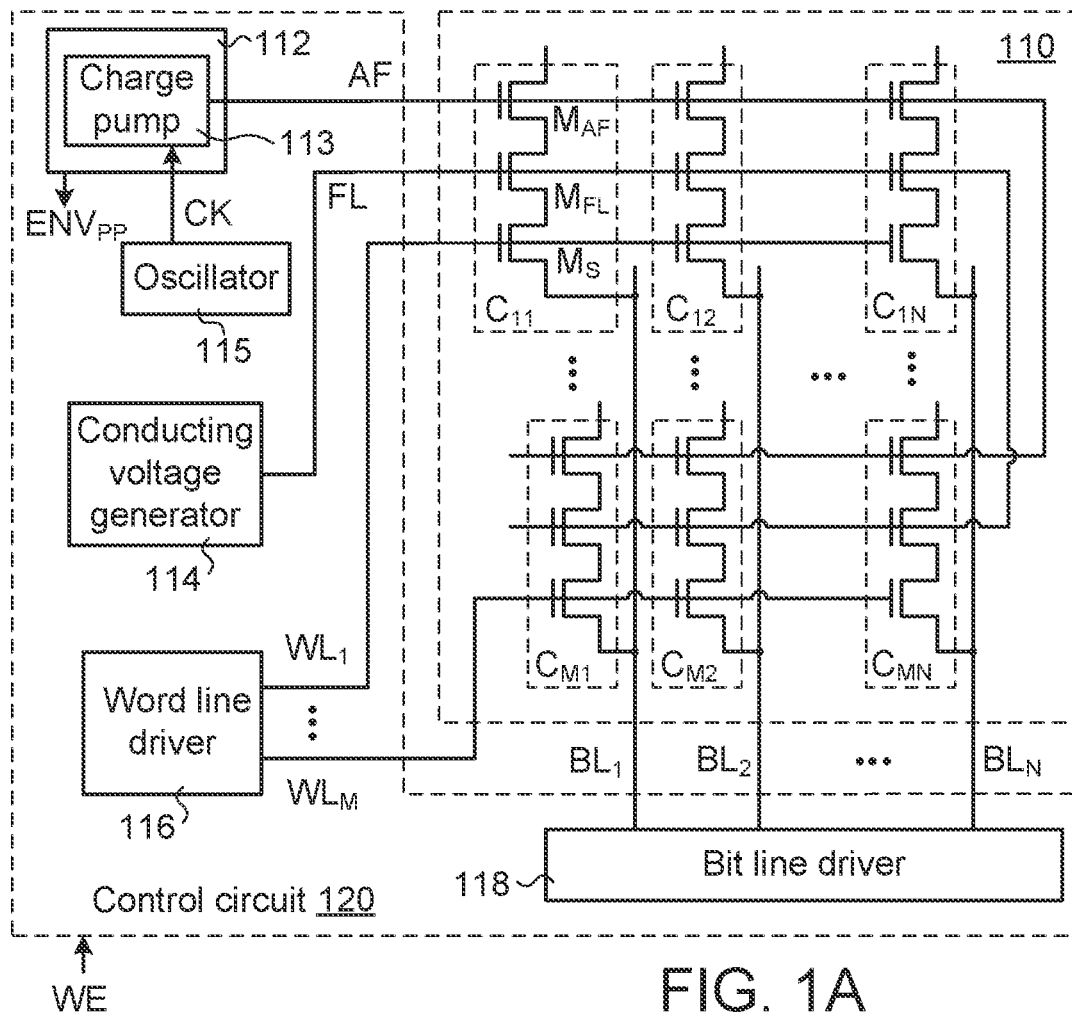
FIG. 1A is a schematic circuit diagram illustrating an antifuse-type non-volatile memory according to a first embodiment of the present invention.

FIG. 1A is a schematic circuit diagram illustrating an antifuse-type non-volatile memory according to a first embodiment of the present invention. As shown in FIG. 1A, the antifuse-type non-volatile memory comprises an antifuse-type memory cell array 110 and a control circuit 120.

The antifuse-type memory cell array 110 comprises M×N antifuse-type non-volatile memory cells $C_{11}$~$C_{MN}$, wherein M and N are positive integers. The antifuse-type memory cell array 110 is connected with an antifuse control line AF, a following control line FL, M word lines $WL_1$~$WL_M$ and N bit lines $BL_1$~$BL_N$. The N memory cells $C_{11}$~$C_{1N}$ in the first row are connected with the antifuse control line AF, the following control line FL and the word line $WL_1$. The N memory cells $C_{11}$~$C_{1N}$ in the first row are respectively connected with the bit lines $BL_1$~$BL_N$. The rest may be deduced by analogy. The N memory cells $C_{M1}$~$C_{MN}$ in the M-th row are connected with the antifuse control line AF, the following control line FL and the word line $WL_M$. The N memory cells $C_{M1}$~$C_{MN}$ in the M-th row are respectively connected with the N bit lines $BL_1$~$BL_N$.

The structures of the M×N memory cells $C_{11}$~$C_{MN}$ are identical. Take the memory cell $C_{11}$ for example. The memory cell $C_{11}$ may be referred as a 3T memory cell. That is, the memory cell $C_{11}$ comprises an antifuse transistor $M_{AF}$, a following transistor $M_{FL}$ and a select transistor $M_S$.

The first drain/source terminal of the select transistor $M_S$ is connected with the bit line $BL_1$. The gate terminal of the select transistor $M_S$ is connected with the word line $WL_1$. The first drain/source terminal of the following transistor $M_{FL}$ is connected with the second drain/source terminal of the select transistor $M_S$. The gate terminal of the following transistor $M_{FL}$ is connected with the following control line FL. The first drain/source terminal of the antifuse transistor $M_{AF}$ is connected with the second drain/source terminal of the following transistor $M_{FL}$. The gate terminal of the antifuse transistor $M_{AF}$ is connected with the antifuse control line AF. The second drain/source terminal of the antifuse transistor $M_{AF}$ is in a floating state.

The control circuit 120 comprises a program voltage generator 112, a conducting voltage generator 114, a word line driver 116 and a bit line driver 118. The program voltage generator 112 is connected with the antifuse control line AF. The conducting voltage generator 114 is connected with the following control line FL. The word line driver 116 is connected with the word lines $WL_1$~$WL_M$. The bit line driver 118 is connected with the bit lines $BL_1$~$BL_N$.

When a program action is performed, the program voltage generator 112 issues a program voltage $V_{PP}$ to the antifuse control line AF, and the conducting voltage generator 114 issues a conducting voltage $V_{FL}$ to the following control line FL. In addition, one of the M word lines $WL_1$~$WL_M$ is activated by the word line driver 116. Consequently, the row of the antifuse-type memory cell array 110 corresponding to the activated word line is determined as the selected row. In addition, a specified bit line of the bit lines $BL_1$~$BL_N$ is activated by the bit line driver 118. According to the activated word line and the activated bit line, the corresponding memory cell in the selected row is determined as the selected memory cell. Consequently, the program action is performed on the selected memory cell.

For example, when the word line $WL_1$ is activated by the word line driver 116, a fixed on voltage $V_{ON}$ is provided to the word line $WL_1$. When the bit line $BL_1$ is activated by the bit line driver 118, a ground voltage (0V) is provided to the bit line $BL_1$. Consequently, the memory cell $C_{11}$ is the selected memory cell. In an embodiment, the program voltage $V_{PP}$ is 6V, the conducting voltage $V_{FL}$ is 2.6V, and the on voltage $V_{ON}$ is 1.6V. It is noted that the magnitudes of the program voltage $V_{PP}$, the conducting voltage $V_{FL}$ and the on voltage $V_{ON}$ are not restricted.

Among the bias voltages provided to the antifuse-type non-volatile memory, the value of the program voltage $V_{PP}$ is the highest. Consequently, a charge pump 113 with the better driving capability is included in the program voltage generator 112 to generate the program voltage $V_{PP}$. By the charge pump 113, a supply voltage (e.g., 3.3V) provided by the antifuse-type non-volatile memory is boosted to a higher program voltage $V_{Pp}$.

The control circuit 120 further comprises an oscillator 115. The oscillator 115 generates a clock signal CK to the charge pump 113. According to the clock signal CK, the supply voltage is boosted to the higher program voltage $V_{PP}$.

Moreover, since the conducting voltage $V_{FL}$ is lower, the conducting voltage generator 114 may be implemented with a low-dropout regulator LDO. Of course, any other appropriate voltage generators are feasible for generating the conducting voltage $V_{FL}$.

Figure 1B:
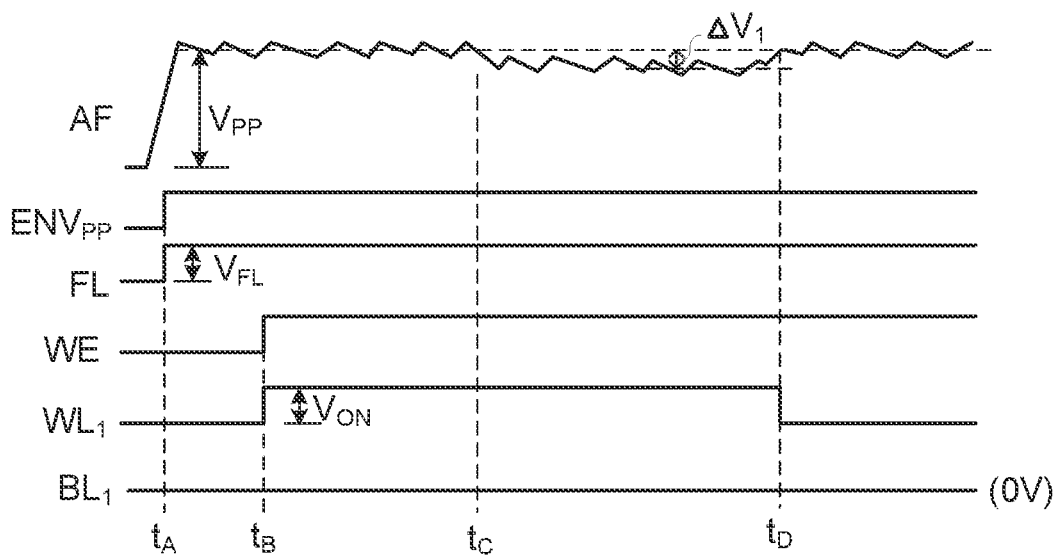
FIG. 1B is a schematic timing waveform diagram illustrating associated signals when the memory cell of the antifuse-type non-volatile memory of the first embodiment undergoes the program action.

FIG. 1B is a schematic timing waveform diagram illustrating associated signals when the memory cell of the antifuse-type non-volatile memory of the first embodiment undergoes the program action. For example, the program action is performed on the memory cell $C_{11}$. Firstly, the antifuse-type non-volatile memory enters a program mode, and the program voltage generator 112 is enabled.

At the time point $t_A$, a program voltage enable signal $ENV_{PP}$ is activated (e.g., switched from a low logic level state to a high logic level state). Meanwhile, the program voltage $V_{PP}$ outputted from the charge pump 113 of the program voltage generator 112 to the antifuse control line AF reaches a predetermined voltage (e.g., 6V). At the same time, the conducting voltage generator 114 issues the conducting voltage $V_{FL}$ to the following control line FL.

At the time point $t_B$, a write enable signal WE is activated (e.g., switched from a low logic level state to a high logic level state). Meanwhile, the program action on the antifuse-type non-volatile memory can be started. For example, the word line driver 116 is operated according to the program voltage enable signal $ENV_{PP}$ and the write enable signal WE. Meanwhile, the word line $WL_1$ is activated by the word line driver 116, and the on voltage $V_{ON}$ is provided to the word line $WL_1$. The other word lines $WL_2$~$WL_M$ are not activated by the word line driver 116. That is, the word line driver 116 provides an off voltage $V_{OFF}$ to the other word lines $WL_2$~$WL_M$. Consequently, the first row of the antifuse-type memory cell array 110 is the selected row. At the same time, the bit line $BL_1$ is activated by the bit line driver 118, and the bit line driver 118 provides the ground voltage (0V) to the bit line $BL_1$. The other bit lines $BL_2$~$BL_N$ are not activated by the bit line driver 118. Moreover, the other bit lines $BL_2$~$BL_N$ are in the floating state. Consequently, the memory cell $C_{11}$ in the selected row is the selected memory cell, and the other memory cells $C_{12}$~$C_{1N}$ in the selected row are unselected memory cells. For example, the off voltage $V_{OFF}$ is the ground voltage (0V).

In the above embodiment, the bit lines $BL_2$~$BL_N$ are in the floating state, and thus the bit lines $BL_2$~$BL_N$ are not activated. In some other embodiments, the bit lines are inactivated by using another method. For example, the bit line driver 118 provides the ground voltage (0V) to activate the bit line $BL_1$, and the bit line driver 118 provides a higher voltage (e.g., 3.3V) to inactivate the bit lines $BL_2$~$BL_N$.

In addition, the program action is performed in plural program cycles. The time length between the time point $t_B$ and the time point $t_D$ is equal to one program cycle. In the program cycle, the voltage provided to the word line $WL_1$ is maintained in the on voltage $V_{ON}$. In the program cycle, the antifuse control line AF receives the program voltage $V_{PP}$, the following control line FL receives the conducting voltage $V_{FL}$, the word line $WL_1$ receives the on voltage $V_{ON}$, and the bit line $BL_1$ receives ground voltage (0V). In the selected memory cell $C_{11}$, the select transistor $M_S$ is turned on, and the following transistor $M_{FL}$ is in a conducting state. Consequently, the select transistor $M_S$ is coupled to the antifuse transistor $M_{AF}$. In addition, the ground voltage (0V) of the bit line $BL_1$ is transferred to the first drain/source terminal of the antifuse transistor $M_{AF}$. Consequently, the voltage stress between the gate terminal and the first drain/source terminal of the antifuse transistor $M_{AF}$ is equal to the program voltage $V_{PP}$.

The gate oxide layer of the antifuse transistor $M_{AF}$ receives the higher voltage stress. Consequently, at the time point $t_C$, the gate oxide layer of the antifuse transistor $M_{AF}$ is ruptured. Consequently, the storage state of the selected memory cell $C_{11}$ is switched from a high-resistance storage state to a low-resistance storage state. Similarly, after the time point $t_D$, the word line driver 116 activates another word line, and the bit line driver 118 activates another bit line. Consequently, another program cycle is started, and the program action is performed on another selected memory cell.

Please refer to FIG. 1B again. Before the time point $t_C$, the gate oxide layer of the antifuse transistor $M_{AF}$ has not been ruptured. Consequently, no program current is generated in the region between the antifuse control line AF and the bit line $BL_1$. At the time point $t_C$, the gate oxide layer of the antifuse transistor $M_{AF}$ is ruptured. Consequently, a program current is generated in the region between the antifuse control line AF and the bit line $BL_1$ until the time point $t_D$. At the time point to, the word line driver 116 provides the off voltage $V_{OFF}$ to the word line $WL_1$. Consequently, the select transistor $M_S$ is turned off, and the selected memory cell $C_{11}$ stops generating the program current. Meanwhile, the program cycle is ended.

As mentioned above, before the time point $t_C$, the gate oxide layer of the antifuse transistor $M_{AF}$ in the selected memory cell $C_{11}$ has not been ruptured. Since no program current is generated, the program voltage $V_{PP}$ provided by the charge pump 113 is more stable.

The charge pump 113 has the better driving capability. Consequently, in case that the gate oxide layer of the antifuse transistor $M_{AF}$ in the selected memory cell $C_{11}$ is ruptured and the program current through the selected memory cell $C_{11}$ is generated after the time point $t_C$, the program voltage $V_{PP}$ from the charge pump 113 is slightly decreased by a voltage drop $\Delta V_1$. That is, in the time interval between the time point $t_C$ and the time point $t_D$, the voltage drop of the program voltage $V_{PP}$ is $\Delta V_1$. However, since the driving capability of the charge pump 113 is strong enough to keep the sufficient program current through the selected memory cell $C_{11}$, the time interval between the time point $t_C$ and the time point to may be regarded as a heating process of the program cycle, to strengthen a filament formed through the gate oxide layer. Due to the sufficient program current, the gate oxide layer of the antifuse transistor $M_{AF}$ is in a solid rupture state. Consequently, it is assured that the selected memory cell $C_{11}$ can be switched to the low-resistance storage state.

Generally, after the gate oxide layer of the antifuse transistor $M_{AF}$ in the selected memory cell $C_{11}$ is ruptured and the program current is generated, the voltage drop of the program voltage $V_{PP}$ is related to the driving capability of the charge pump 113. In case that the driving capability of the charge pump 113 is stronger, the voltage drop of the program voltage $V_{PP}$ is lower. In case that the driving capability of the charge pump 113 is weaker, the voltage drop of the program voltage $V_{PP}$ is higher.

Figure 1C:
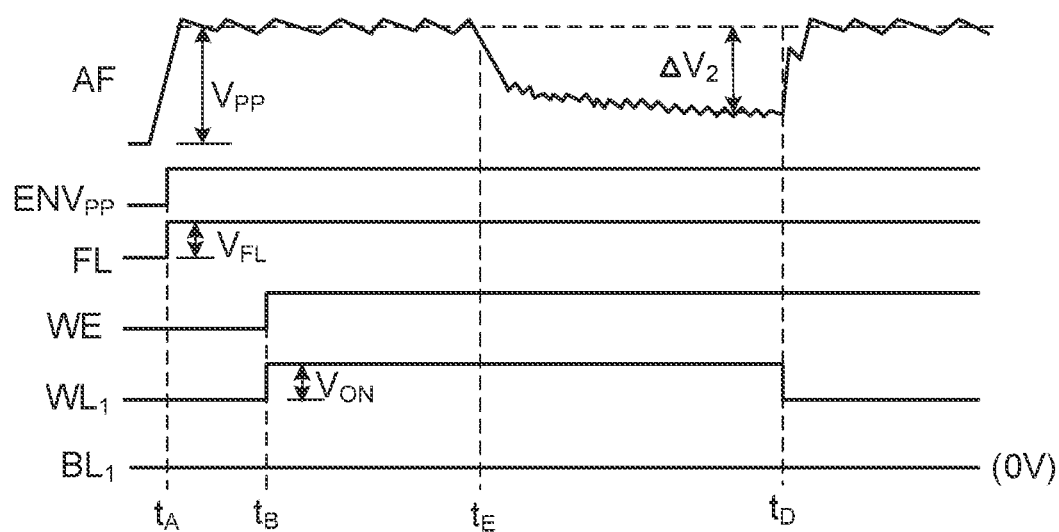
FIG. 1C is a schematic timing waveform diagram illustrating associated signals when the memory cell of the antifuse-type non-volatile memory of the first embodiment undergoes the program action and the driving capability of the charge pump is weaker.

FIG. 1C is a schematic timing waveform diagram illustrating associated signals when the memory cell of the antifuse-type non-volatile memory of the first embodiment undergoes the program action and the driving capability of the charge pump is weaker. Similarly, the program action is performed on the selected memory cell $C_{11}$ of the antifuse-type non-volatile memory.

Before the time point $t_E$, the gate oxide layer of the antifuse transistor $M_{AF}$ in the selected memory cell $C_{11}$ has not been ruptured. Since no program current is generated, the program voltage $V_{PP}$ provided by the charge pump 113 is more stable.

The charge pump 113 has the weaker driving capability. Consequently, in case that the gate oxide layer of the antifuse transistor $M_{AF}$ in the selected memory cell $C_{11}$ is ruptured and the program current is generated after the time point $t_E$, the program voltage $V_{PP}$ from the charge pump 113 is largely decreased by a voltage drop $\Delta V_2$. In other words, the time interval between the time point $t_E$ and the time point to may be regarded as a heating process of the program cycle. Since the driving capability of the charge pump 113 is weaker, the voltage drop $\Delta V_2$ of the program voltage $V_{PP}$ is obvious. Consequently, the program current is very low. After the heating process, the gate oxide layer of the antifuse transistor $M_{AF}$ cannot reach the solid rupture state. In other words, the selected memory cell $C_{11}$ is in a program failure condition.

Figure 2:
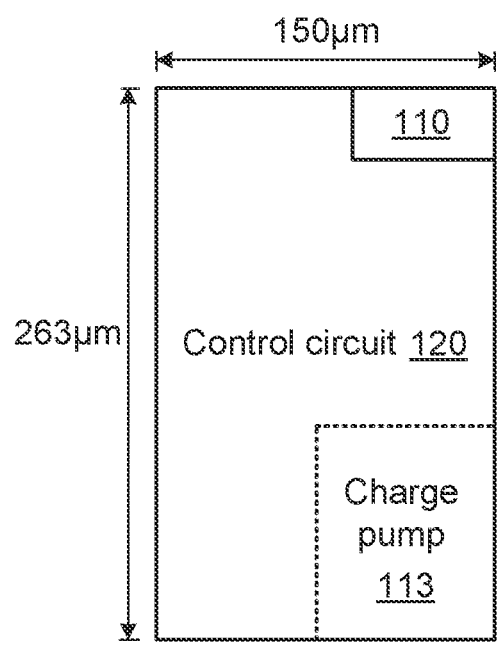
FIG. 2 schematically illustrates the IC chip layout structure of a small-capacity antifuse-type non-volatile memory.

FIG. 2 schematically illustrates the IC chip layout structure of a small-capacity antifuse-type non-volatile memory. For example, the antifuse-type non-volatile memory comprises a control circuit 120 and an antifuse-type memory cell array 110 with the capacity of 1 k bytes. In order to design the charge pump 113 with better driving capability, the size of the charge pump 113 would be larger, which occupies a great portion of the IC chip area.

Generally, the fabricating cost of the IC chip is increased with the increasing size of the IC chip. In case that the small-capacity antifuse-type non-volatile memory is equipped with the charge pump 113 with better driving capability, the size of the overall IC chip cannot be further reduced. Since the fabricating cost cannot be reduced, the competitive advantage will be lost.

In other words, it is preferred that the small-capacity antifuse-type non-volatile memory is equipped with the charge pump 113 with weaker driving capability. In case that the control circuit and the control method are specially designed, the antifuse-type non-volatile memory can be operated normally. Since the antifuse-type non-volatile memory has the smaller IC chip size and the reduced cost, the competitive advantage will be increased.

Figure 3A:
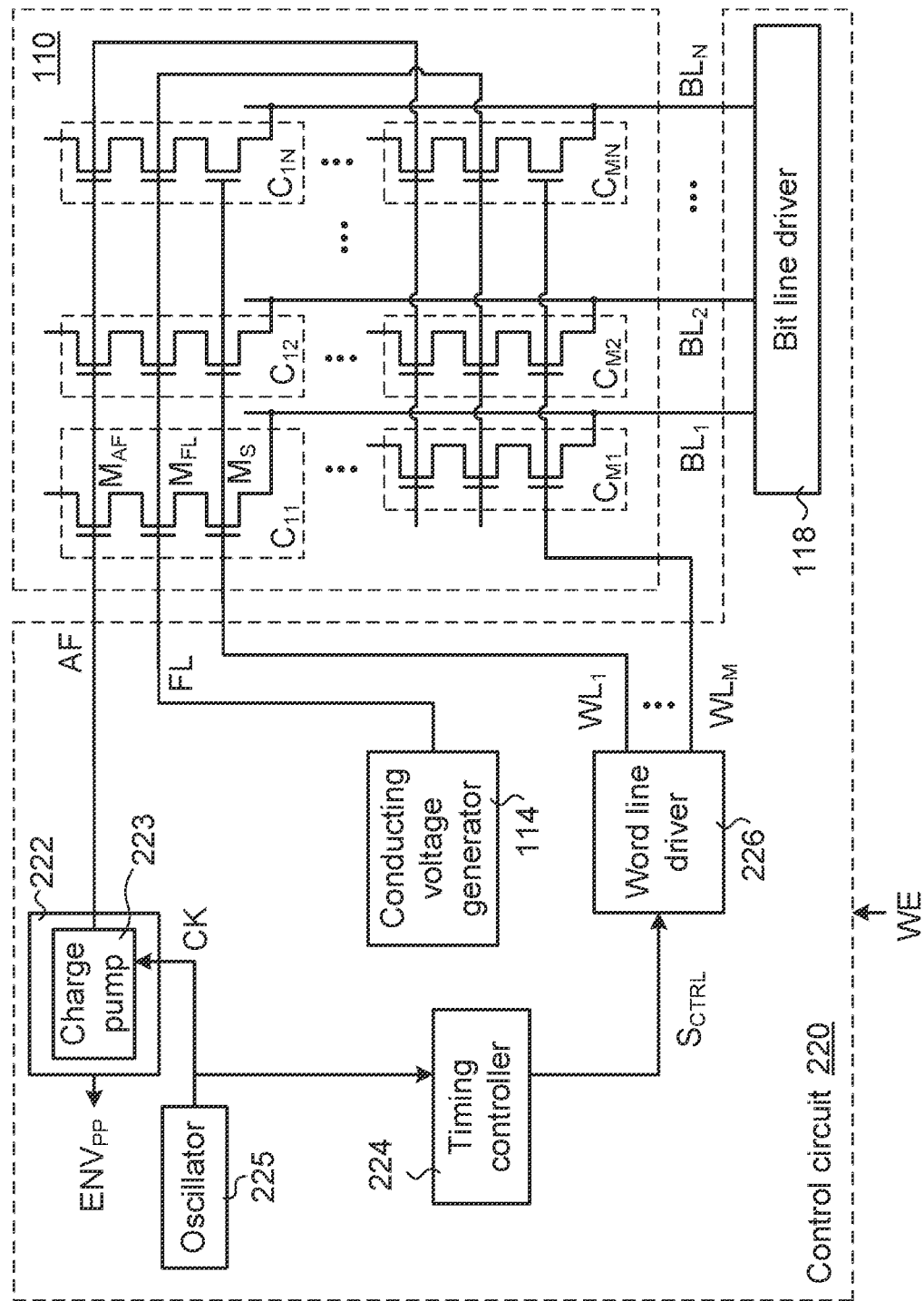
FIG. 3A is a schematic circuit diagram illustrating an antifuse-type non-volatile memory according to a second embodiment of the present invention.

FIG. 3A is a schematic circuit diagram illustrating an antifuse-type non-volatile memory according to a second embodiment of the present invention. As shown in FIG. 3A, the antifuse-type non-volatile memory comprises an antifuse-type memory cell array 110 and a control circuit 220. The antifuse-type memory cell array 110 comprises M×N antifuse-type non-volatile memory cells $C_{11}$~$C_{MN}$, wherein M and N are positive integers. The structure of the antifuse-type non-volatile memory 110 is similar to that of the antifuse-type non-volatile memory 110 shown in FIG. 1A, and not redundantly described herein.

The control circuit 220 comprises a program voltage generator 222, a conducting voltage generator 114, an oscillator 225, a timing controller 224, a word line driver 226 and a bit line driver 118. The program voltage generator 222 is connected with the antifuse control line AF. The conducting voltage generator 114 is connected with the following control line FL. The word line driver 226 is connected with the word lines $WL_1 \sim WL_M$. The bit line driver 118 is connected with the bit lines $BL_1 \sim BL_N$. Similarly, the conducting voltage generator 114 is implemented by a low-dropout regulator (LDO). The conducting voltage generator 114 issues the conducting voltage $V_{FL}$.

Moreover, a charge pump 223 with the weaker driving capability is included in the program voltage generator 222. The charge pump 223 is connected with the oscillator 225. By the charge pump 223, the supply voltage is boosted to the program voltage $V_{PP}$ according to the clock signal CK provided by the oscillator 225. For example, the program voltage $V_{PP}$ is 6V, and the conducting voltage $V_{FL}$ is 2.6V.

When a program action is performed, the program voltage generator 222 issues a program voltage $V_{PP}$ to the antifuse control line AF, and the conducting voltage generator 114 issues a conducting voltage $V_{FL}$ to the following control line FL. In addition, one of the M word lines $WL_1 \sim WL_M$ is activated by the word line driver 226. Consequently, the row of the antifuse-type memory cell array 110 corresponding to the activated word line is determined as the selected row. In addition, a specified bit line of the bit lines $BL_1 \sim BL_N$ is selectively activated by the bit line driver 118. According to the activated word line and the activated bit line, the corresponding memory cell in the selected row is determined as the selected memory cell. Consequently, the program action is performed on the selected memory cell.

In the second embodiment, the timing controller 224 receives the clock signal CK. When the program action is performed, a timing control signal $S_{CTRL}$ is generated, and the timing control signal $S_{CTRL}$ is issued to the word line driver 226. In the program cycle of the program action, the word line driver 226 generates a pulse signal according to the timing control signal $S_{CTRL}$. The pulse signal is switched between the on voltage $V_{ON}$ and the off voltage $V_{OFF}$. The pulse signal is provided to activate word line. For example, the on voltage $V_{ON}$ is a fixed voltage (1.6V), and the off voltage $V_{OFF}$ is 0V. In other words, the amplitude of the pulse signal generated by the word line driver 226 is not changed. Moreover, the first level state of the pulse signal is the on voltage $V_{ON}$ (e.g., 1.6V), and the second level state of the pulse signal is the off voltage $V_{OFF}$ (e.g., 0V).

FIG. 3B is a schematic timing waveform diagram illustrating associated signals when the memory cell of the antifuse-type non-volatile memory of the second embodiment undergoes the program action. For example, the program action is performed on the memory cell $C_{11}$.

Firstly, the antifuse-type non-volatile memory enters a program mode, and the program voltage generator 222 is enabled.

At the time point $t_1$, a program voltage enable signal $ENV_{PP}$ is activated. Meanwhile, the program voltage $V_{PP}$ outputted from the charge pump 223 of the program voltage generator 222 to the antifuse control line AF reaches a predetermined voltage (e.g., 6V). At the same time, the conducting voltage generator 114 issues the conducting voltage $V_{FL}$ to the following control line FL.

At the time point $t_2$, a write enable signal WE is activated. Meanwhile, the program action on the antifuse-type non-volatile memory can be started. The time interval between the time points $t_2$ and $t_{10}$ may be regarded as a program cycle. For example, in the program cycle, the word line $WL_1$ is activated by the word line driver 226, but the other word lines $WL_2 \sim WL_M$ are not activated. In addition, the bit line $BL_1$ is activated by the bit line driver 118, but the other bit lines $BL_2 \sim BL_N$ are not activated. Under this circumstance, the first row of the antifuse-type memory cell array 110 is the selected row. Consequently, the memory cell $C_{11}$ in the selected row is the selected memory cell, and the other memory cells $C_{12} \sim C_{1N}$ in the selected row are unselected memory cells.

In the program cycle between the time point $t_2$ and the time point $t_{10}$, the voltage provided from the word line driver 226 to the activated word line $WL_1$ is switched between the on voltage $V_{ON}$ and the off voltage $V_{OFF}$ according to the timing control signal $S_{CTRL}$. In other words, the program cycle is divided into plural on periods and plural off periods by the word line driver 226. In the on periods $T_{ON1}$, $T_{ON2}$, $T_{ON3}$ and $T_{ON4}$, the word line driver 226 provides the on voltage $V_{ON}$ to the activated word line $WL_1$. In the off periods $T_{OFF1}$, $T_{OFF2}$ and $T_{OFF3}$, the word line driver 226 provides the off voltage $V_{OFF}$ to the activated word line $WL_1$. Please refer to FIG. 3B again. In the on period $T_{ON1}$ between the time points $t_2$ and $t_4$, the word line driver 226 provides the on voltage $V_{ON}$ to word line $WL_1$. Consequently, the select transistor $M_S$ is turned on. Before the time point $t_3$, the gate oxide layer of the antifuse transistor $M_{AF}$ has not been ruptured. Consequently, no program current is generated in the region between the antifuse control line AF and the bit line $BL_1$. At the time point $t_3$, the gate oxide layer of the antifuse transistor $M_{AF}$ is ruptured. Consequently, a program current is generated in the region between the antifuse control line AF and the bit line $BL_1$. As mentioned above, when the charge pump 223 with smaller area is used, the driving capability of the charge pump 223 may not be strong enough to keep the program voltage $V_{PP}$ at an expected level. In other words, in the time interval between the time point $t_3$ and the time point $t_4$, the program voltage $V_{PP}$ on the antifuse control line AF continuously drops. At the time point $t_4$, the on period $T_{ON1}$ is ended.

In the off period $T_{OFF1}$ between the time point $t_4$ and the time point $t_5$, the word line driver 226 provides the off voltage $V_{OFF}$ to the word line $WL_1$. Consequently, the select transistor $M_S$ is turned off, and the select memory cell $C_{11}$ stops generating the program current. Consequently, in the off period $T_{OFF1}$, the program voltage $V_{PP}$ from the charge pump 223 rapidly rises to the predetermined voltage (e.g., 6V). At the time point $t_5$, the off period $T_{OFF1}$ is ended.

In the on period $T_{ON2}$ between the time points $t_5$ and $t_6$, the word line driver 226 provides the on voltage $V_{ON}$ to word line $WL_1$. Meanwhile, the select transistor $M_S$ is turned on. Consequently, the selected memory cell $C_{11}$ generates the program current. In the on period $T_{ON2}$, although the program voltage $V_{PP}$ drops, since the voltage is still high enough to cause the selected memory cell $C_{11}$ to generate the sufficient program current, the heating process can be successfully performed on the selected memory cell $C_{11}$. At the time point $t_6$, the on period $T_{ON2}$ is ended.

In the off period $T_{OFF2}$ between the time point $t_6$ and the time point $t_7$, and the off period $T_{OFF3}$ between the time point $t_8$ and the time point $t_9$, the operation is similar to the off period $T_{OFF1}$ between the time point $t_4$ and the time point $t_5$, and will not be described repeatedly herein.

In the on period $T_{ON3}$ between the time point $t_7$ and the time point $t_8$, and the on period $T_{ON4}$ between the time point $t_9$ and the time point $t_{10}$, the operation is similar to the on period $T_{ON2}$, and will not be described repeatedly herein.

In this embodiment, the timing controller 224 generates the timing control signal $S_{CTRL}$. The word line driver 226 provides the on voltage $V_{ON}$ and the off voltage $V_{OFF}$ to the activated word line according to the timing control signal $S_{CTRL}$. For example, the activated word line and the timing control signal $S_{CTRL}$ may have the same waveform. Moreover, in the total time period of the plural on periods $T_{ON1}$, $T_{ON2}$, $T_{ON3}$ and $T_{ON4}$, the program current and the program voltage $V_{PP}$ is sufficient to rupture the gate oxide layer of the antifuse transistor $M_{AF}$ in the selected memory cell $C_{11}$, and a heating process is completed. Consequently, the gate oxide layer of the antifuse transistor $M_{AF}$ is in a solid rupture state.

As shown in FIG. 3B, the on period $T_{ON1}$ is longer to assure that the gate oxide layer of the antifuse transistor $M_{AF}$ in the selected memory cell $C_{11}$ is ruptured. Then, the on periods $T_{ON2}$, $T_{ON3}$ and $T_{ON4}$ are shorter to avoid large voltage drop from the charge pump 223, and assure that program current of the selected memory cell $C_{11}$ is sufficient to perform the heating process. Consequently, the gate oxide layer of the antifuse transistor $M_{AF}$ can reach the solid rupture state. After the program cycle, it is assured that the selected memory cell $C_{11}$ is in the low-resistance storage state.

It is noted that, in some embodiments, the on period $T_{ON1}$ can be shorter than the on periods $T_{ON2}$, $T_{ON3}$ and $T_{ON4}$ according to the characteristic of the memory cell. It is also noted that the number of the on periods, the length of each on period and the length of each off period are not restricted. The number of the on periods, the time width of the on period and the time width of the off period can be adjusted according to the driving capacity of the charge pump 223. Another example of the operations of the word bit driver 226 will be described as follows.

FIG. 3C is a schematic timing waveform diagram illustrating another signal when the memory cell of the antifuse-type non-volatile memory of the second embodiment undergoes the program action. For example, the program action is performed on the memory cell $C_{11}$.

Firstly, the antifuse-type non-volatile memory enters a program mode, and the program voltage generator 222 is enabled.

At the time point $t_X$, a program voltage enable signal $ENV_{PP}$ is activated. Meanwhile, the program voltage $V_{PP}$ outputted from the charge pump 223 of the program voltage generator 222 to the antifuse control line AF reaches a predetermined voltage (e.g., 6V). At the same time, the conducting voltage generator 114 issues the conducting voltage $V_{FL}$ to the following control line FL.

At the time point ty, a write enable signal WE is activated. Meanwhile, the program action on the antifuse-type non-volatile memory can be started. The time interval between the time point ty and the time point $t_z$ may be regarded as a program cycle. In the program cycle, the program cycle is divided into plural on periods $T_{ON1} \sim T_{ON7}$ and plural off periods $T_{OFF1} \sim T_{OFF6}$ by the word line driver 226 according to the timing control signal $S_{CTRL}$. The time widths of the on periods $T_{ON1} \sim T_{ON7}$ are equal. The time widths of the off periods $T_{OFF1} \sim T_{OFF6}$ are equal.

Please refer to FIG. 3C again. In the on periods $T_{ON1}$, $T_{ON2}$ and $T_{ON3}$ and the off periods $T_{OFF1}$, $T_{OFF2}$ and $T_{OFF3}$, the program voltage $V_{PP}$ is maintained at the predetermined voltage (e.g., 6V). In other words, the gate oxide layer of the antifuse transistor $M_{AF}$ has not been ruptured. Consequently, no program current is generated in the region between the antifuse control line AF and the bit line $BL_1$.

In the on period $T_{ON4}$, the gate oxide layer of the antifuse transistor $M_{AF}$ is ruptured. As mentioned above, the driving capability of the charge pump 223 is weaker. Consequently, the program voltage $V_{PP}$ on the antifuse control line AF continuously drops. In addition, the program current is continuously decreased.

In the off period $T_{OFF4}$, the select memory cell $C_{11}$ stops generating the program current. That is, the charge pump 223 does not provide the program current. Consequently, in the off period $T_{OFF4}$, the program voltage $V_{PP}$ of the charge pump 223 rapidly rises to the predetermined voltage (e.g., 6V).

In the on period $T_{ON5}$, the selected memory cell $C_{11}$ generates the program current. Consequently, in the on period $T_{ON5}$, the program voltage $V_{PP}$ drops. However, the program voltage $V_{PP}$ is high enough to generate the sufficient program current. Consequently, the heating process can be successfully performed on the selected memory cell $C_{11}$.

Similarly, in the off period $T_{OFF5}$ and the off period $T_{OFF6}$, the program voltage $V_{PP}$ is boosted to the predetermined voltage (e.g., 6V) by the charge pump 223 again. Similarly, in the on period $T_{ON6}$ and the on period $T_{ON7}$, the program voltage $V_{PP}$ is high enough to generate the sufficient program current. Consequently, the heating process can be successfully performed on the selected memory cell $C_{11}$.

In this embodiment, the timing controller 224 generates the timing control signal $S_{CTRL}$. The word line driver 226 provides the on voltage $V_{ON}$ and the off voltage $V_{OFF}$ to the activated word line according to the timing control signal $S_{CTRL}$. Moreover, in the total time period of the plural on periods $T_{ON1} \sim T_{ON7}$, the program current is sufficient to rupture the gate oxide layer of the antifuse transistor $M_{AF}$ in the selected memory cell $C_{11}$, and a heating process is completed. Consequently, the gate oxide layer of the antifuse transistor $M_{AF}$ is in a solid rupture state.

Figure 4A:
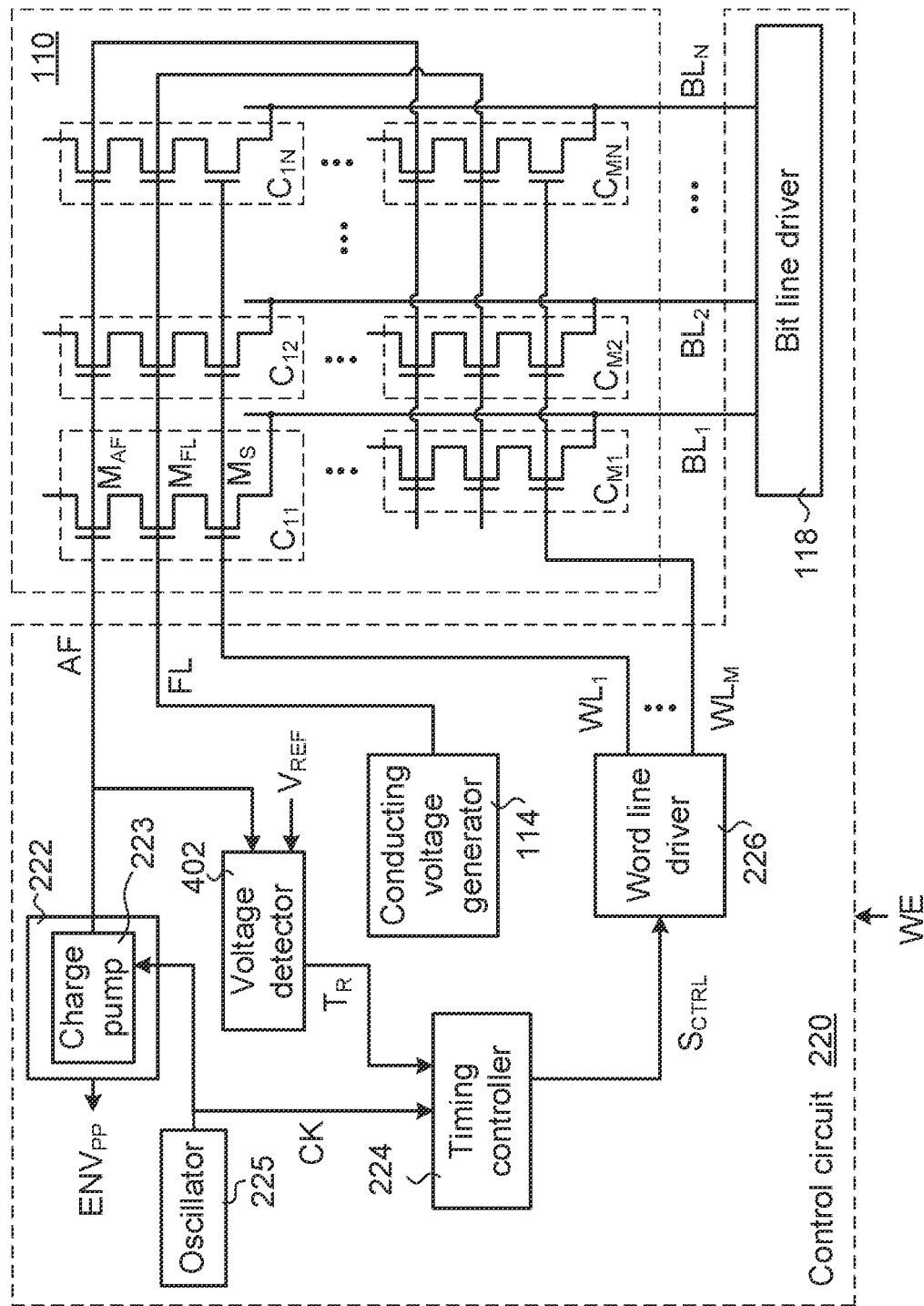
FIG. 4A is a schematic circuit diagram illustrating an antifuse-type non-volatile memory according to a third embodiment of the present invention.

FIG. 4A is a schematic circuit diagram illustrating an antifuse-type non-volatile memory according to a third embodiment of the present invention. In comparison with the second embodiment, the control circuit 220 of the antifuse-type non-volatile memory of the third embodiment further comprises a voltage detector 402. For succinctness, only the connecting relationship between the voltage detector 402 and the associated components will be described as follows.

A first detection terminal of the voltage detector 402 is connected with the antifuse control line AF to receive the program voltage $V_{PP}$. A second detection terminal of the voltage detector 402 receives a reference voltage $V_{REF}$. An output terminal of the voltage detector 402 is connected with the timing controller 224. If the program voltage $V_{PP}$ is lower than the reference voltage $V_{REF}$, a triggering signal $T_R$ is activated by the voltage detector 402. When the triggering signal $T_R$ is activated, the timing controller 224 generates the timing control signal $S_{CTRL}$ to the word line driver 226 according to the clock signal CK. In the program cycle of the program action, the voltage provided from the word line driver 226 to the activated word line $WL_1$ is switched between the on voltage $V_{ON}$ and the off voltage $V_{OFF}$ according to the timing control signal $S_{CTRL}$.

Figure 4B:
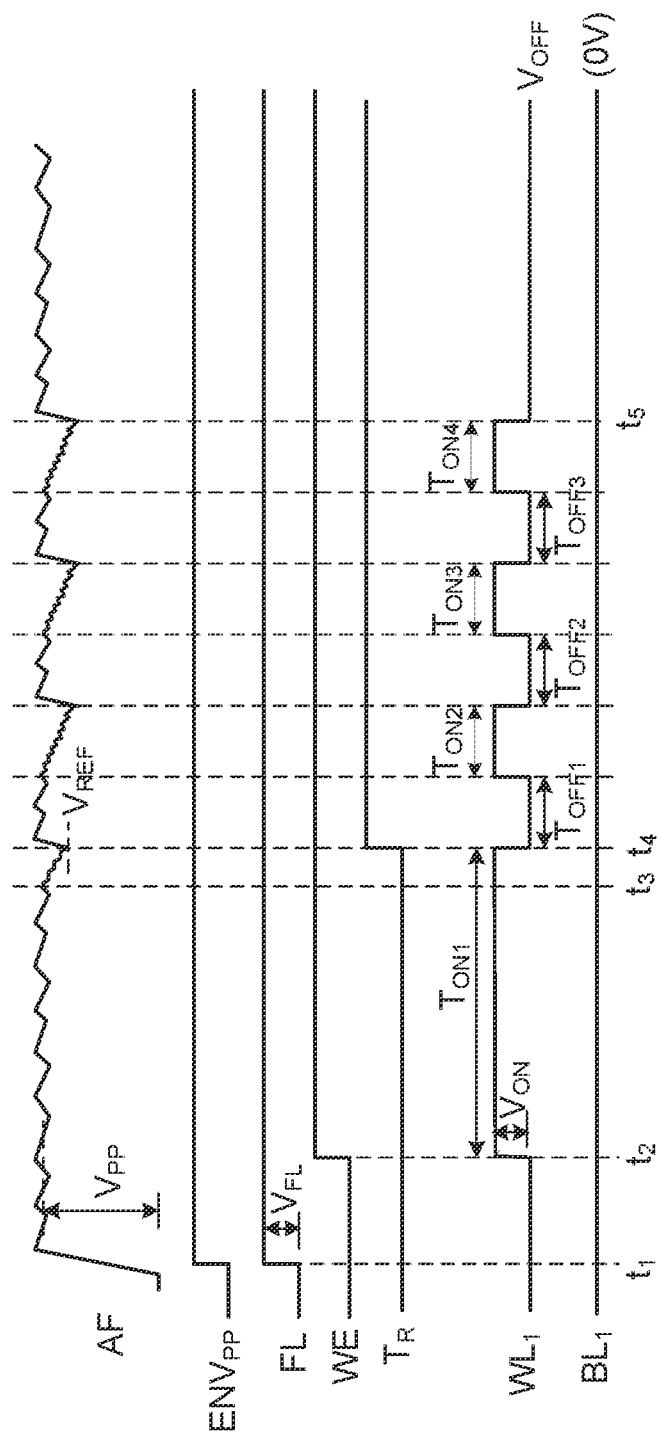
FIG. 4B is a schematic timing waveform diagram illustrating associated signals when the memory cell of the antifuse-type non-volatile memory of the third embodiment undergoes the program action.

FIG. 4B is a schematic timing waveform diagram illustrating associated signals when the memory cell of the antifuse-type non-volatile memory of the third embodiment undergoes the program action. For example, the program action is performed on the memory cell $C_{11}$.

Firstly, the antifuse-type non-volatile memory enters a program mode, and the program voltage generator 222 is enabled.

At the time point $t_1$, a program voltage enable signal $ENV_{PP}$ is activated. Meanwhile, the program voltage $V_{PP}$ outputted from the charge pump 223 of the program voltage generator 222 to the antifuse control line AF reaches a predetermined voltage (e.g., 6V). At the same time, the conducting voltage generator 114 issues the conducting voltage $V_{FL}$ to the following control line FL.

At the time point $t_2$, a write enable signal WE is activated. Meanwhile, the program action on the antifuse-type non-volatile memory can be started. The time interval between the time points $t_2$ and $t_5$ may be regarded as a program cycle. At the time point $t_2$, the word line driver 226 provides the on voltage $V_{ON}$ to the activated word line $WL_1$. In addition, an on period $T_{ON1}$ is started.

At the time point $t_3$, the gate oxide layer of the antifuse transistor $M_{AF}$ is ruptured. Consequently, a program current is generated in the region between the antifuse control line AF and the bit line $BL_1$. Consequently, the program voltage $V_{PP}$ on the antifuse control line AF continuously drops. In addition, the program current is continuously decreased. At the time point $t_4$, the program voltage $V_{PP}$ is lower than the reference voltage $V_{REF}$. Consequently, the triggering signal $T_R$ is activated by the voltage detector 402. Meanwhile, the timing controller 224 activates the timing control signal $S_{CTRL}$ to the word line driver 226 in response to the activated triggering signal $T_R$. Consequently, the on period $T_{ON1}$ is ended. In the next program cycle, the voltage detector 402 determines whether the triggering signal $T_R$ is activated according to the result of comparing the program voltage $V_{PP}$ with the reference voltage $V_{REF}$. In other words, the voltage detector 402 determines the end time point of the on period $T_{ON1}$.

Similarly, in the off periods $T_{OFF1}$, $T_{OFF2}$ and $T_{OFF3}$, the program voltage $V_{PP}$ is boosted to the predetermined voltage (e.g., 6V) by the charge pump 223 again. Similarly, in the on periods $T_{ON2}$, $T_{ON3}$ and $T_{ON4}$, the program voltage $V_{PP}$ is high enough to generate the sufficient program current. Consequently, the heating process can be successfully performed on the selected memory cell $C_{11}$. In practice, the time width of the on period $T_{ON1}$ is usually larger than the other on periods $T_{ON2}$, $T_{ON3}$, $T_{ON4}$ when the antifuse-type non-volatile memory is equipped with the voltage detector 402.

In this embodiment, the timing controller 224 immediately activates the timing control signal $S_{CTRL}$ for the word line driver to end the on period $T_{ON1}$ when the triggering signal $T_R$ is activated at the time point $t_4$. The word line driver 226 provides the on voltage $V_{ON}$ and the off voltage $V_{OFF}$ to the activated word line according to the timing control signal $S_{CTRL}$. Moreover, in the total time period of the plural on periods $T_{ON1}$, $T_{ON2}$, $T_{ON3}$ and $T_{ON4}$, the program current is sufficient to rupture the gate oxide layer of the antifuse transistor $M_{AF}$ in the selected memory cell $C_{11}$, and a heating process is completed. Consequently, the gate oxide layer of the antifuse transistor $M_{AF}$ is in a solid rupture state.

In another embodiment, the triggering signal $T_R$ and the timing control signal $S_{CTRL}$ may be activated at different time point. For example, the timing controller 224 may activate the timing control signal $S_{CTRL}$ with a predetermined delay time after the triggering signal $T_R$ is activated. Consequently, the word line driver ends the on period $T_{ON1}$ in response to the activation time of the timing control signal $S_{CTRL}$. That is to say, the on period $T_{ON1}$ in FIG. 4B maybe ended after the time point $T_4$.

Furthermore, in comparison with the fixed time width of the on period $T_{ON1}$ in FIG. 3B of the second embodiment, the on period $T_{ON1}$ in FIG. 4B of the third embodiment may vary with the activation of the triggering signal $T_R$.

Figure 5:
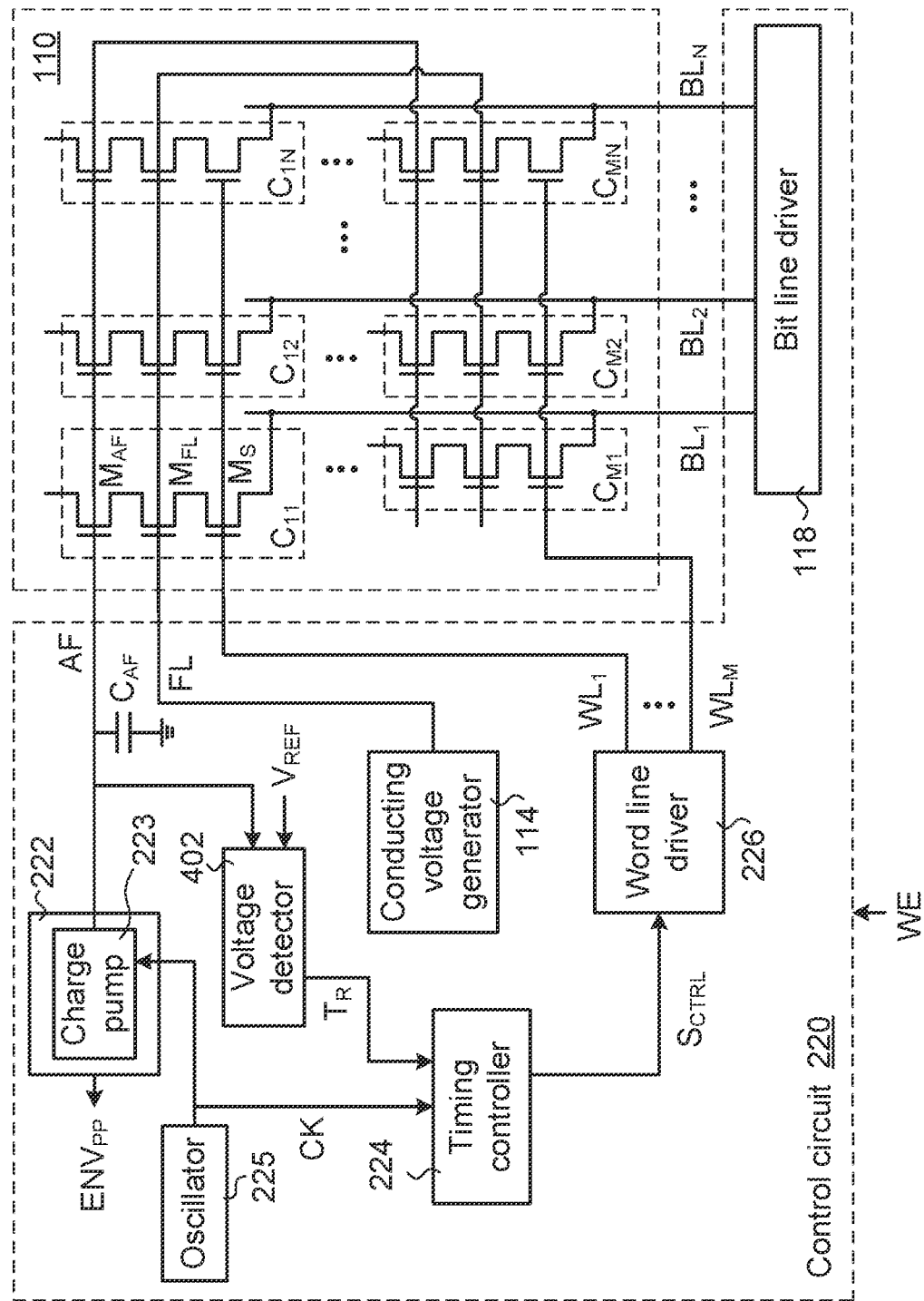
FIG. 5 is a schematic circuit diagram illustrating an antifuse-type non-volatile memory according to a fourth embodiment of the present invention.

FIG. 5 is a schematic circuit diagram illustrating an antifuse-type non-volatile memory according to a fourth embodiment of the present invention. In comparison with third embodiment, the control circuit 220 of the antifuse-type non-volatile memory of the fourth embodiment further comprises a capacitor $C_{AF}$. The capacitor $C_{AF}$ is connected between the antifuse control line AF and the ground terminal to enhance the driving capability of the charge pump 223. The connecting relationship between other components and the associated signals are similar to those of the third embodiment, and not redundantly described herein. Of course, in a variant example of the antifuse-type non-volatile memory of the first embodiment or the second embodiment, the antifuse-type non-volatile memory of the fourth embodiment further comprises a capacitor $C_{AF}$.

From the above descriptions, the present invention provides an antifuse-type non-volatile memory. During the program cycle of the program action, the timing controller 224 generates the timing control signal $S_{CTRL}$. The word line driver 226 provides the on voltage $V_{ON}$ and the off voltage $V_{OFF}$ to the activated word line according to the timing control signal $S_{CTRL}$. Moreover, in the total time period of the plural on periods $T_{ON1}$, $T_{ON2}$, $T_{ON3}$ and $T_{ON4}$, the program current is sufficient to rupture the gate oxide layer of the antifuse transistor $M_{AF}$ in the selected memory cell $C_{11}$, and a heating process is completed. Consequently, the gate oxide layer of the antifuse transistor $M_{AF}$ is in a solid rupture state. In other words, the program action can be performed on the selected memory cell $C_{11}$ successfully.

In the above embodiments, each of the memory cells $C_{11}$~$C_{MN}$ in the antifuse-type memory cell array 110 is a 3T memory cell. It is noted that numerous modifications and alterations may be made while retaining the teachings of the invention. For example, in another embodiment, each of the memory cells in the antifuse-type memory cell array 110 is a 2T memory cell. That is, the 2T memory cell comprises antifuse transistor $M_{AF}$ and the select transistor $M_S$ only. The first drain/source terminal of the select transistor $M_S$ is connected with the corresponding bit line. The gate terminal of the select transistor $M_S$ is connected with the corresponding word line. The first drain/source terminal of the antifuse transistor $M_{AF}$ is coupled to the second drain/source terminal of the select transistor $M_S$. The gate terminal of the antifuse transistor $M_{AF}$ is connected with the antifuse control line AF. The second drain/source terminal of the antifuse transistor $M_{AF}$ is in the floating state. Since the antifuse-type memory cell array with the 2T memory cells is not equipped with the following control line FL, the conducting voltage generator can be omitted from the control circuit of the antifuse-type non-volatile memory.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An antifuse-type non-volatile memory, comprising:
   an antifuse-type memory cell array comprising a first memory cell, wherein the first memory cell is connected with an antifuse control line, a first word line and a first bit line, and the first memory cell comprises an antifuse transistor and a select transistor, wherein a first drain/source terminal of the select transistor is connected with the first bit line, a gate terminal of the select transistor is connected with the first word line, a first drain/source terminal of the antifuse transistor is coupled to a second drain/source terminal of the select transistor, and a gate terminal of the antifuse transistor is connected with the antifuse control line; and a control circuit comprising:
an oscillator generating a clock signal;
a program voltage generator comprising a charge pump, wherein the charge pump is connected with the oscillator to receive the clock signal, wherein when a program action is performed, a supply voltage is boosted to a program voltage by the charge pump according to the clock signal, and the program voltage is provided to the antifuse control line;
a timing controller connected with the oscillator, wherein the timing controller receives the clock signal and generates a timing control signal;
a word line driver connected with the first word line of the antifuse-type memory cell array, wherein the word line driver is connected with the timing controller to receive the timing control signal; and
a bit line driver connected with the first bit line of the antifuse-type memory cell array, wherein in a program cycle of the program action, the first word line is activated by the word line driver, and the first bit line is activated by the bit line driver, so that the first memory cell is a selected memory cell,
wherein in the program cycle of the program action, the word line driver issues a pulse signal to the first word line according to the timing control signal, wherein a first level of the pulse signal is an on voltage, and a second level of the pulse signal is an off voltage, wherein after the program cycle, a storage state of the first memory cell is switched from a high-resistance storage state to a low-resistance storage state.

2. The antifuse-type non-volatile memory as claimed in claim 1, wherein the first memory cell further comprises a following transistor, and the control circuit comprises a conducting voltage generator, wherein a first drain/source terminal of the following transistor is connected with the second drain/source terminal of the select transistor, a second drain/source terminal of the following transistor is connected with the first drain/source terminal of the antifuse transistor, a gate terminal of the following transistor is connected with a following control line, and the conducting voltage generator is connected with the following control line, wherein when the program action is performed, the conducting voltage generator provides a conducting voltage to the following control line, and the following transistor is in a conducting state, so that the antifuse transistor is coupled to the select transistor.

3. The antifuse-type non-volatile memory as claimed in claim 1, wherein the program cycle is divided into plural on periods and plural off periods by the word line driver according to the pulse signal, wherein the word line driver provides the on voltage to the first word line during the plural on periods, and the word line driver provides the off voltage to the first word line during the plural off periods.

4. The antifuse-type non-volatile memory as claimed in claim 3, wherein during a first on period of the plural on periods, a gate oxide layer of the antifuse transistor in the selected memory cell is ruptured, and a program current is generated, wherein during the on periods other than the first on period, the selected memory cell is subjected to a heating process by the program current, so that the gate oxide layer of the antifuse transistor is in a solid rupture state, wherein during the plural off periods, the program current is not generated by the selected memory cell.

5. The antifuse-type non-volatile memory as claimed in claim 3, wherein a time width of a first on period is larger than a time width of each of the on periods other than the first on period.

6. The antifuse-type non-volatile memory as claimed in claim 3, wherein time widths of the plural on periods are identical, wherein in a total time period of the plural on periods, a program current is sufficient to rupture a gate oxide layer of the antifuse transistor in the selected memory cell, and a heating process is completed, so that the gate oxide layer of the antifuse transistor is in a solid rupture state.

7. The antifuse-type non-volatile memory as claimed in claim 1, wherein the control circuit further comprises a capacitor, and the capacitor is connected between the antifuse control line and a ground terminal.

8. The antifuse-type non-volatile memory as claimed in claim 1, wherein the control circuit further comprises a voltage detector, wherein a first detection terminal of the voltage detector is connected with the antifuse control line to receive the program voltage, a second detection terminal of the voltage detector receives a reference voltage, and an output terminal of the voltage detector is connected with the timing controller.

9. The antifuse-type non-volatile memory as claimed in claim 8, wherein the program cycle is divided into plural on periods and plural off periods by the word line driver according to the pulse signal, wherein the word line driver provides the on voltage to the first word line during the plural on periods, and the word line driver provides the off voltage to the first word line during the plural off periods.

10. The antifuse-type non-volatile memory as claimed in claim 9, wherein an end time point of a first on period of the plural on periods is determined by the voltage detector.

11. The antifuse-type non-volatile memory as claimed in claim 10, wherein if the program voltage is lower than the reference voltage, a gate oxide layer of the antifuse transistor in the selected memory cell is ruptured, a program current is generated, and a triggering signal is activated by the voltage detector.

12. The antifuse-type non-volatile memory as claimed in claim 11, wherein when the triggering signal is activated, the first on period of the plural on periods is ended by the word line driver under control of the timing controller.

13. The antifuse-type non-volatile memory as claimed in claim 11, when the triggering signal is activated, the timing controller activates the timing control signal with a predetermined delay time after the triggering signal is activated, and the first on period of the plural on periods is ended by the word line driver in response to an activation time of the timing control signal.

14. The antifuse-type non-volatile memory as claimed in claim 11, wherein during the on periods other than the first on period, the selected memory cell is subjected to a heating process by the program current, so that the gate oxide layer of the antifuse transistor is in a solid rupture state, wherein during the plural off periods, the program current is not generated by the selected memory cell.

15. The antifuse-type non-volatile memory as claimed in claim 10, wherein a time width of the first on period is larger than a time width of each of the on periods other than the first on period.

* * * * *